United States Patent
Silvernail et al.

(10) Patent No.: US 6,888,307 B2
(45) Date of Patent: May 3, 2005

(54) PATTERNED OXYGEN AND MOISTURE ABSORBER FOR ORGANIC OPTOELECTRONIC DEVICE STRUCTURES

(75) Inventors: Jeffrey Alan Silvernail, Yardley, PA (US); Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 255 days.

(21) Appl. No.: 09/933,987

(22) Filed: Aug. 21, 2001

(65) Prior Publication Data

US 2003/0038590 A1 Feb. 27, 2003

(51) Int. Cl.⁷ .............................................. H05B 33/00
(52) U.S. Cl. .......................... 313/512; 313/497; 313/504; 313/506; 313/507; 428/69; 428/690; 445/24
(58) Field of Search .................................. 313/512, 497, 313/504–507, 511; 445/24; 428/69, 690

(56) References Cited

U.S. PATENT DOCUMENTS

| | | | | |
|---|---|---|---|---|
| 4,357,557 A | | 11/1982 | Inohara et al. .............. 313/509 |
| 5,051,654 A | | 9/1991 | Nativi et al. ................ 313/506 |
| 5,591,379 A | * | 1/1997 | Shores ........................ 252/194 |
| 5,707,745 A | | 1/1998 | Forrest et al. .............. 428/432 |
| 5,757,126 A | | 5/1998 | Harvey, III et al. ........ 313/506 |
| 5,771,562 A | | 6/1998 | Harvey, III et al. ........ 29/592.1 |
| 5,849,442 A | * | 12/1998 | Liu et al. ..................... 430/28 |
| 5,866,978 A | * | 2/1999 | Jones et al. ................. 313/495 |
| 5,882,761 A | | 3/1999 | Kawami et al. ............. 428/69 |
| 5,894,193 A | * | 4/1999 | Amrine et al. .............. 313/495 |
| 5,929,562 A | * | 7/1999 | Pichler ....................... 313/506 |
| 5,931,713 A | * | 8/1999 | Watkins et al. .............. 445/55 |
| 5,962,962 A | | 10/1999 | Fujita et al. ................. 313/412 |
| 6,081,071 A | * | 6/2000 | Rogers ........................ 313/512 |
| 6,100,627 A | * | 8/2000 | Carretti et al. .............. 313/309 |
| 6,146,225 A | | 11/2000 | Sheats et al. ................ 445/24 |
| 6,226,890 B1 | * | 5/2001 | Boroson et al. .............. 34/472 |
| 6,284,342 B1 | * | 9/2001 | Ebisawa et al. ............. 428/69 |
| 6,383,664 B2 | * | 5/2002 | Bernius et al. ............. 428/690 |
| 6,420,031 B1 | * | 7/2002 | Parthasarathy et al. .. 428/411.1 |
| 6,465,953 B1 | * | 10/2002 | Duggal ....................... 313/553 |
| 6,624,570 B1 | * | 9/2003 | Nishio et al. ............... 313/506 |

FOREIGN PATENT DOCUMENTS

| | | | | |
|---|---|---|---|---|
| WO | WO 99/02277 | | 1/1999 | ............ B05D/5/12 |
| WO | WO 00/16938 | * | 3/2000 | ............ B23B/7/02 |

* cited by examiner

*Primary Examiner*—Nimeshkumar D. Patel
*Assistant Examiner*—Sikha Roy
(74) *Attorney, Agent, or Firm*—Mayer Fortkort & Williams, PC; David B. Bonham, Esq.

(57) ABSTRACT

An OLED device structure and a method of making the same. The OLED device structure comprises (a) a substrate, (b) an OLED display area comprising one or more active pixels disposed over the substrate, wherein each of the one or more active pixels comprises an anode region, a cathode region and a light-emitting region, (c) a cover over the OLED display area, wherein the cover permits transmission of light from the one or more active pixels and an outer environment, and wherein the cover and the substrate cooperate to restrict transmission of oxygen and water vapor from the outer environment to the OLED display area, and (d) a patterned getter layer disposed between the substrate and the cover, wherein the patterned getter layer is configured so as to substantially avoid obstructing the transmission of light from the one or more pixels. Also disclosed are a flexible OLED device and an organic optoelectronic device structures having related configurations.

36 Claims, 6 Drawing Sheets

PATTERNED OXYGEN AND MOISTURE ABSORBER FOR ORGANIC OPTOELECTRONIC DEVICE STRUCTURES

FIELD OF THE INVENTION

The present invention relates to structures that protect organic optoelectronic devices from species in the surrounding environment.

BACKGROUND OF THE INVENTION

Organic optoelectronic devices, including organic light emitting devices, organic phototransistors, organic photodetectors, and organic photovoltaic devices, are known in the art and are frequently used in connection with multi-device arrays.

For example, organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and are relatively easy and inexpensive to fabricate. Also, OLEDs readily lend themselves to applications requiring a wide variety of colors and to applications that concern large-area devices.

Figure 1A:
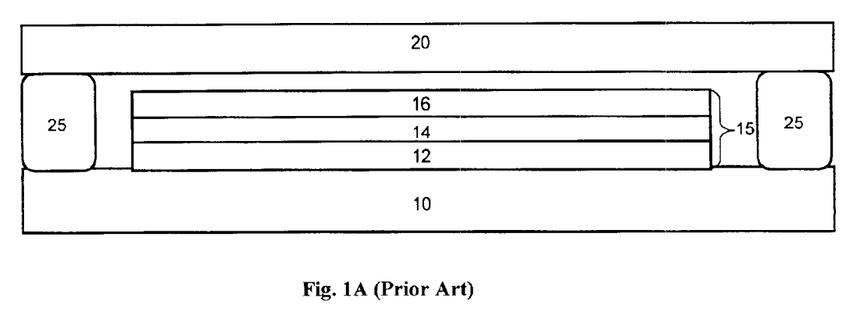
FIGS. 1A and 1B are simplified schematic representations (cross-sectional views) of known OLED structures.

In general, two-dimensional OLED arrays for imaging applications are known in the art and typically include an OLED display area that contains a plurality of active pixels arranged in rows and columns. FIG. 1A is a simplified schematic representation (cross-sectional view) of an OLED structure of the prior art. The OLED structure shown includes a single active pixel 15 which includes an electrode region such as anode region 12, a light emitting region 14 over the anode region 12, and another electrode region such as cathode region 16 over the a light emitting region 14. The active pixel 15 is disposed on a substrate 10. With the aid of a sealing region 25, the cover 20 and the substrate 10 cooperate to restrict transmission of oxygen and water vapor from an outer environment to the active pixel 15.

Traditionally, light from the light emitting layer 14 was transmitted downward through the substrate 10. In such a "bottom-emitting" configuration, the substrate 10 and anode 12 are formed of transparent materials. The cathode 16 and cover 20, on the other hand, need not be transparent in this configuration.

Figure 1B:
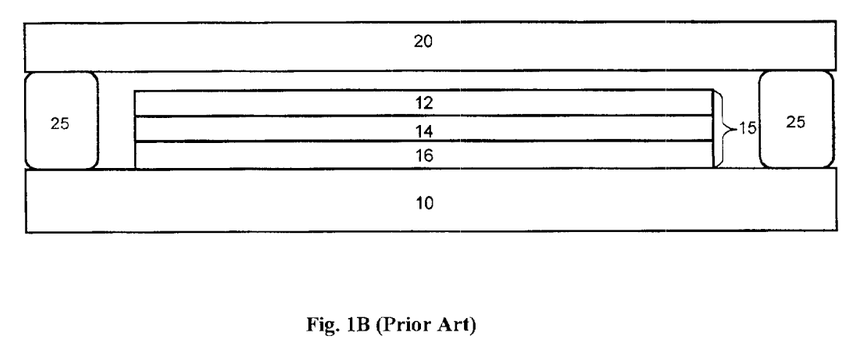

Other OLED architectures are also known in the art, including "top-emitting" OLEDs and transparent OLEDs (or "TOLEDs"). For top-emitting OLEDs, light from the light emitting layer 14 is transmitted upward through cover 20. Hence, the substrate 10 can be formed of opaque material, while the cover 20 is transparent. In some top-emitting configurations, which are based on a design like that illustrated in FIG. 1A, a transparent material is used for the cathode 16, while the anode 12 need not be transparent. In other top-emitting configurations, the positions of the anode 12 and cathode 16 in FIG. 1A are switched as illustrated in FIG. 1B, such that a transparent anode 12 is used. In this embodiment, the cathode 16 can be opaque.

For TOLEDs, in which light is emitted in both up and down directions (that is, out of both the top and bottom of the device), the substrate 10, anode 12, cathode 16 and cover 20 are all transparent. The configuration used can be like that of FIG. 1A or that of FIG. 1B.

Unfortunately, certain OLED structure components, such as reactive metal cathode components, are susceptible to oxygen and moisture, which exist in the ambient atmosphere and can produce deleterious effects that can severely limit the lifetime of the devices. For example, moisture and oxygen are known to increase "dark spot areas" in connection with OLED structures.

As a result, a getter material is frequently applied inside the encapsulated region of the device to absorb any moisture and oxygen entering the device. However, due to the fashion in which the getter material is disposed inside the cover, if this device design were to be used in connection with a top-emitting or transparent OLED configuration, then the getter would obstruct the transmission of light to the outer environment.

SUMMARY OF THE INVENTION

The above and other challenges are addressed by the present invention. According to an embodiment of the present invention, an OLED device structure is provided that comprises (a) a substrate, (b) an OLED display area comprising one or more active pixels disposed over the substrate, wherein each of the one or more active pixels comprises an anode region, a cathode region and a light-emitting region, (c) a cover over the OLED display area, wherein the cover permits transmission of light from the one or more active pixels and an outer environment, and wherein the cover and the substrate cooperate to restrict transmission of oxygen and water vapor from the outer environment to the OLED display area, and (d) a patterned getter layer disposed between the substrate and the cover, wherein the patterned getter layer is configured so as to substantially avoid obstructing the transmission of light from the one or more pixels.

The patterned getter layer can be provided, for example, on the substrate or on the cover. The patterned getter layer can also be provided, for example, at a position that is laterally beyond the OLED display area (for instance, in the form of a ring that laterally surrounds the OLED display area) or it can be provided within the OLED display area (for instance, over non-emitting regions of the OLED display area between at least some of the of the pixels).

Preferred materials for the patterned getter layer include Group IIA metals (for example, calcium metal and barium metal) and Group IIA metal oxides (for example, calcium oxide and barium oxide).

If desired, portions of the patterned getter layer can be sufficiently narrow to prevent the patterned getter layer from cracking when the OLED device structure is flexed during normal service. For example, the getter material can be provided in the form of a plurality of narrow bands or small dots.

Numerous configurations are possible. For example, in some cases, the substrate, the anode region, the cathode region and the cover each permits transmission of light between the light-emitting region and the outer environment. In other cases, the substrate is opaque and the cover is transparent, in which case a cathode or anode that permits transmission of light between the light-emitting region and the outer environment can be disposed over the light-emitting region.

According to another embodiment of the present invention, a flexible OLED device structure is provided which comprises: (a) a flexible substrate; (b) a flexible OLED display area comprising a plurality of active pixels disposed over the substrate, wherein each of the plurality of active pixels comprises an anode region, a cathode region and a light-emitting region; (c) a flexible cover over the OLED display area, wherein at least one of the flexible substrate and the flexible cover permits transmission of light from the plurality of active pixels to an outer environment, and wherein the flexible cover and the flexible substrate cooperate to restrict transmission of oxygen and water vapor from the outer environment to the OLED display area; and (d) a patterned getter layer disposed between the flexible substrate and the flexible cover, wherein at least a portion of the patterned getter layer is provided over non-emitting regions of the OLED display area between at least some of the plurality of pixels. In this embodiment, the flexible substrate, the flexible cover, or both, preferably comprise a composite barrier region that further comprises two or more planarizing layers and two or more high-density layers. Moreover, if desired, a portion of the patterned getter layer can be provided adjacent each of the plurality of pixels.

According to another embodiment of the present invention, an organic optoelectronic device structure is provided that comprises (a) a substrate, (b) an optoelectronic device, selected from an organic phototransistor, an organic photodetector and an organic photovoltaic device, disposed over the substrate; (c) a cover over the organic optoelectronic device, wherein the cover permits transmission of light between an outer environment and the organic optoelectronic device, and wherein the cover and the substrate cooperate to restrict transmission of oxygen and water vapor from the outer environment to the organic optoelectronic device; and (d) a patterned getter layer disposed between the substrate and the cover, wherein the patterned getter layer is configured so as to substantially avoid obstructing the transmission of light between the outer environment to the organic optoelectronic device. In some embodiments, an array of the organic optoelectronic devices is provided, and at least a portion of the patterned getter layer is provided between the organic optoelectronic devices within the array.

According to yet another embodiment of the invention, a method of making an OLED device structure is provided. The method comprises (a) providing a substrate, (b) forming an OLED display area over the substrate, wherein the OLED display area comprises one or more active pixels comprising an anode region, a cathode region and a light-emitting region, (c) providing a cover over the OLED display area, wherein the cover permits transmission of light from the one or more active pixels to an outer environment, and wherein the cover and the substrate cooperate to restrict transmission of oxygen and water vapor from the outer environment to the OLED display area, and (d) providing a patterned getter layer between the substrate and the cover, wherein the patterned getter layer is configured so as to substantially avoid obstructing the transmission of light from the one or more pixels.

In some preferred embodiments, the patterned getter layer comprises a metal and is provided by vacuum deposition through a masking layer. In other preferred embodiments, the patterned getter layer comprises a metal oxide and is provided by applying a getter material in the form of a paste, for example, by screen-printing or by extrusion.

An advantage of the present invention is that organic optoelectronic device structures are provided that are effective in protecting certain sensitive components of the structures from oxygen, moisture and other harmful species in the surrounding atmosphere.

Another advantage of the present invention is that top emitting and transparent OLED structures are provided that afford protection from these harmful species.

Yet another advantage of the present invention is that flexible OLED structures are provided that afford protection from these harmful species.

These and other embodiments and advantages of the present invention will become readily apparent to those of ordinary skill in the art upon review of the disclosure to follow.

BRIEF DESCRIPTION OF THE DRAWINGS

As is typically the case with such figures, the above are simplified schematic representations presented for purposes of illustration only, and the actual structures will differ in numerous respects including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein. For example, the drawings are directed to OLED structures, but other optoelectronic structures, such organic phototransistor structures, organic photodetector structures, and organic photovoltaic device structures are also contemplated.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. As used herein, a "patterned layer" layer can consist of a collection of discrete portions, for example, a collection of narrow bands or dots.

Figure 2A:
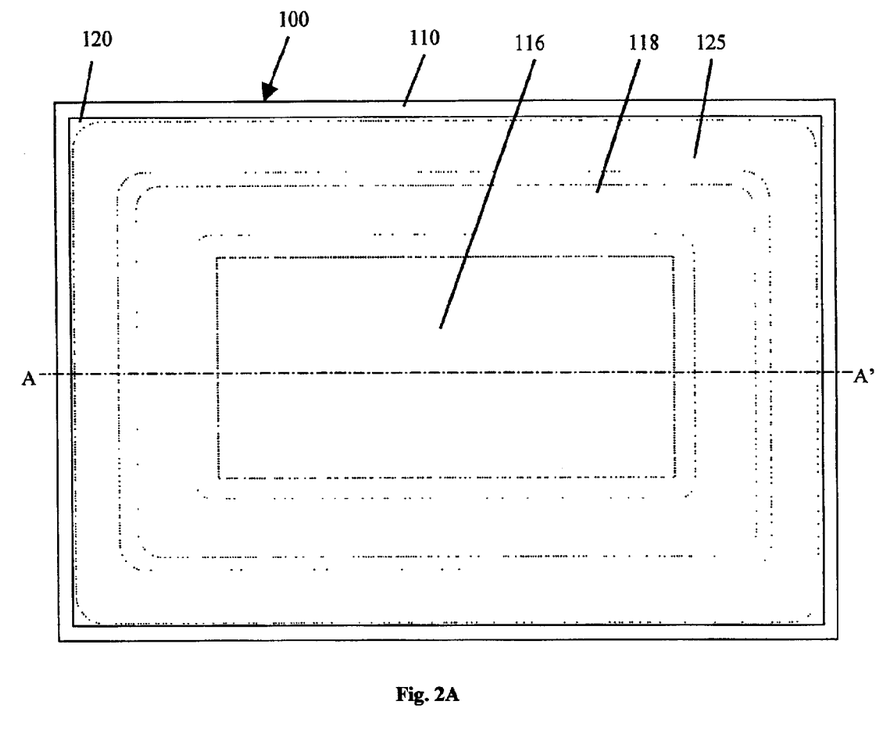
FIGS. 2A and 2B are simplified schematic representations (plan and cross-sectional views) of an OLED structure in accordance with an embodiment of the present invention.
Figure 2B:
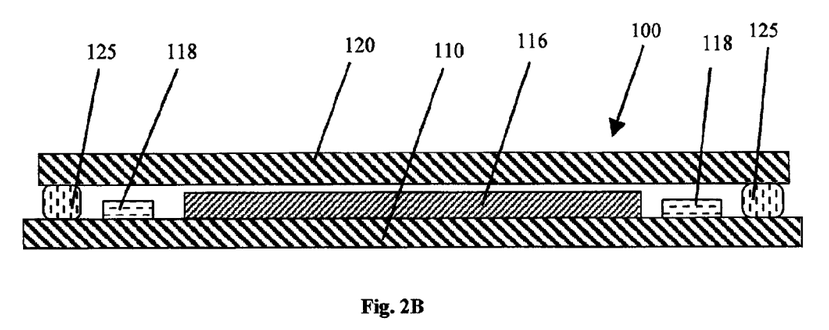

FIG. 2A is a simplified schematic representation (plan view) of an OLED structure 100 in accordance with an embodiment of the present invention. FIG. 2B is a cross-sectional view of the OLED structure 100 of FIG. 2A taken along line A—A'. The OLED structure 100 includes an OLED display area 116 situated on a substrate 110. Over the OLED display area 116 is a cover 120. In some preferred embodiments, the cover 120 is not in contact with the OLED display area 116, as shown. In others, the cover 120 will contact the OLED display area. A sealing region 125 is provided between the substrate 110 and cover 120. The sealing region 125 encircles the OLED display area 116, and cooperates with the substrate 110 and cover 120 to surround the OLED.

The substrate 110 and cover 120 are typically selected to, among other things, restrict transmission of oxygen and water from the outside environment to the inside of the OLED display area 116. Depending on the application, the substrate 110 and cover 120 can be opaque or transparent. For traditional bottom-emitting OLED structures, the substrate 110 will be transparent, as least in part, while the cover 120 can be opaque. For top-emitting OLED structures, the substrate 110 can be opaque, while the cover 120 will be will be transparent, at least in part. For TOLED structures, both the substrate 110 and the cover 120 will be transparent, at least in part.

The materials selected for the substrate 110 and cover 120 will depend upon the application at hand. Metals offer excellent barrier properties, and can be provided in a number of configurations as a cover for the OLED displays, such as in the form of metal cans and foils. Preferred metals include aluminum, gold, nickel, nickel alloys and indium, as well as other metals known in the art.

Semiconductors such as silicon offer good barrier properties to water, oxygen and other harmful species and also provide a substrate upon which electronic circuitry can be built.

Ceramics also offer low permeability and provide transparency in some cases. Preferred ceramics are glasses, more preferably soda lime and borosilicate glasses.

Polymers are often preferred where optical transparency is desired or where ease of continuous manufacture (e.g., web-based manufacture) is desired. Preferred low permeability polymers include polyesters, polyethersulphones, polyimides and fluorocarbons.

Composite materials are also among those materials preferred for use in connection with the substrate 110 and cover 120. Composite materials are advantageous, for example, in that they are flexible. For instance, OLED structures are known in the art that are referred to a flexible OLEDs (or "FOLEDS"). As the name suggests, these structures are flexible in nature. As a result, many rigid materials used in non-flexible OLEDs for substrate and cover materials are not used in connection with FOLEDs. For example, glass, which is impermeable but is typically rigid, is not ordinarily used for FOLED constructions. Composite barrier layers, on the other hand, are flexible and are used in FOLEDs.

Figure 3:
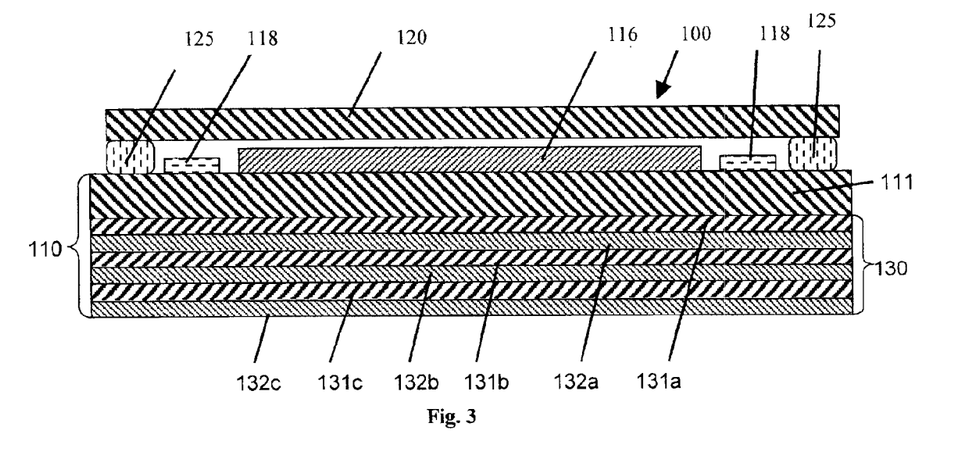
FIG. 3 is a simplified schematic representation (cross-sectional view) of an OLED structure in accordance with an embodiment of the present invention.

Referring to FIG. 3, for example, a substrate 110 is shown which comprises a substrate sublayer 111 and a composite barrier layer 130.

The composite barrier layer 130 includes a plurality of cooperative barrier sub-layers that include both sub-layers of planarizing material 131$a$–$c$ and sub-layers of high-density material 132$a$–$c$. These cooperative barrier sub-layers are preferably provided in an alternating configuration. Preferably, 1 to 10 pairs of these sub-layers, more preferably 3 to 7 pairs, are used. Thus, although three alternating pairs are illustrated in FIG. 3, other sub-layer arrangements are possible.

The cooperative barrier sub-layers 131$a$–$c$ and 132$a$–$c$ are disposed on the polymeric substrate sub-layer 111 in the embodiment shown. During manufacture, the substrate sub-layer 111 acts as a foundation upon which the cooperative barrier sub-layers 131$a$–$c$ and 132$a$–$c$ can be laid. Preferred materials for the polymer substrate sub-layer 111 include polyesters, polyethersulphones, polyimides and fluorocarbons that are capable of providing a strong adhesive bond with other materials. Preferred polyesters include polyethylene terephthalate. Preferred fluorocarbon polymers include Aclar® fluoropolymer available from Honeywell. The polymer substrate sub-layer 110 typically ranges from 75 to 625 microns in thickness.

By "planarizing material" is meant a material that forms a smooth planar surface upon application, rather than forming a surface that reflects irregular contours of the underlying surface. Preferred planarizing materials include polymers, such as fluorinated polymers, parylenes, cyclotenes and polyacrylates. Sub-layers of such planarizing materials 131$a$–$c$ can be provided using techniques known in the art, for example, by dipping, spin coating, sputtering, evaporative coating, spraying, flash evaporation, chemical vapor deposition and so forth.

By "high-density material" is meant a material with sufficiently close atomic spacing such that diffusion of contaminant and deleterious species, particularly water and oxygen, are hindered. Preferred high-density materials include inorganic materials such as metal oxides, metal nitrides, metal carbides and metal oxynitrides. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. Sub-layers of high-density material 132$a$–$c$ can be applied using techniques known in the art such as thermal evaporation, sputtering, PECVD methods and electron-beam techniques.

It is noted that the substrate 110 as illustrated in FIG. 3 can be inverted such that the substrate sub-layer 111 is at the bottommost position. Moreover, if desired, the cover 120 can include a composite barrier layer like composite barrier layer 130 above. Furthermore, to the extent that the cooperative barrier sub-layers 131$a$–$c$ and 132$a$–$c$ can be applied to an existing structure, the substrate sub-layer 111 may be eliminated.

Examples of composite barrier layers comprising sub-layers of both high-density material and planarizing material formed on a polymer substrate sub-layer are disclosed, for example, in U.S. Pat. No. 5,757,126, the entire disclosure of which is hereby incorporated by reference.

Referring again to FIGS. 2A and 2B, the sealing region 125 is preferably selected both to provide a barrier to adverse exterior environmental species, including water and oxygen, and to provide good adhesion with the substrate 110 and cover 120, without damaging the OLED display area 116 during curing (e.g., due to out-gassing). Preferred materials for these purposes include ultraviolet-curable and thermally curable epoxy materials. Preferred epoxy materials are ultraviolet curable, single-part epoxies such as Epotek OG159. The thickness of the adhesive region typically ranges from 25 to 100 microns.

Due to the presence of the sealing region 125, an additional sealing region (not shown) can be used, if desired, which would otherwise have an adverse effect on the OLED (e.g., due to harmful precursor and/or by-product materials). As one example, flux is typically used with solder to improve adhesion during application, which then can enter the active region of the device if not blocked. As another example, certain low-viscosity epoxies result in wicking of uncured liquid, which if unblocked, can enter the active region. Also, certain two-part epoxies can result in significant out-gassing of harmful materials during curing which can enter the active region. However, due to the presence of the sealing region 125, such solders (e.g., indium alloy solders), low viscosity epoxies and two-part epoxies (e.g., Torr Seal epoxy resin available from Varian Vacuum Technologies) can be used outwardly and laterally from the sealing region, if desired.

The OLED display area 116 can be any OLED display area known in the art. The OLED display area 116 can comprise one or many active pixels, which as, noted above, typically comprise an anode layer, a cathode layer, and a light-emitting layer (emission layer) disposed between the anode and cathode layer.

Depending on the application, the anode layer may be transparent or opaque. Opaque anode materials include metals such as gold, chromium and magnesium/silver, while transparent anode materials include metal oxides such as indium tin oxide (ITO) and zinc tin oxide. Similarly, the cathode can be transparent or opaque depending on the application. Opaque cathode materials may include metals such as aluminum and aluminum/lithium or other materials is known in the art, while transparent cathode materials may include metal/metal oxide combinations such as Mg—Ag/ITO or other materials known in the art.

The light emitting layer can be provided in connection with a number of configurations, including the following: (a) a three-layer configuration comprising a hole transporting sub-layer, an emission sub-layer and an electron transporting sub-layer (i.e., a double heterostructure configuration), (b) a two-layer configuration comprising a hole transporting sub-layer and a sub-layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art.

Along with the OLED display area 116, the patterned getter layer 118 of FIGS. 2A and 2B is provided within the sealed package that is created by the substrate 110, sealing region 125 and cover 120. The getter layer 118 can be formed from any getter material that reacts readily with active gases (including water and oxygen), forming stable low-vapor-pressure chemical compounds so as to remove the active gases from the gas phase. In the embodiment illustrated in FIGS. 2A and 2B, the patterned getter layer 118 is provided in the form of a ring that laterally surrounds the OLED display area 116. As a result, in the event that reactive gases such as water and oxygen penetrate the sealed package in the vicinity of the sealing region 125, which is where the greatest amount of water/oxygen penetration frequently occurs, the reactive gases reaching the patterned getter layer 118 react with it before reaching the OLED display area 116 and harming it. Note that although the patterned getter layer 118 is provided on the substrate 110, it could just as easily be moved vertically upward to a position on the cover 120.

Preferred getter materials include Group IIA metals and metal oxides, such as calcium metal (Ca), barium metal (Ba), calcium oxide (CaO) and barium oxide (BaO). Preferred products include HICAP2000, a calcium oxide paste obtainable from Cookson SPM (Alpha Metals).

Patterned getter layers in metal form can be applied to the substrate or cover using, for example, a number of techniques including vacuum deposition techniques such as thermal evaporation, sputtering, and electron-beam techniques. The desired pattern can be formed, for example, by resorting to a mask such as a shadow mask during the deposition process.

Patterned getter layers in paste form, such as the above-mentioned CaO paste, can be provided by a number of techniques including screen-printing and dispensation through a syringe (using, for example, a robotic arm).

In some instances, the patterned getter layer 118 may not have sufficient flexibility for the application at hand, for example, when the patterned getter layer 118 is used within a flexible OLED (FOLED) device. One way to address this issue is to make the dimension of the patterned getter layer small in the direction of the flex that may be encountered during normal service, for example, by forming the patterned getter layer from a number of narrow bands or dots. Two embodiments of such a small-dimensioned patterned getter layer are illustrated in FIGS. 4 and 5.

Figure 4:
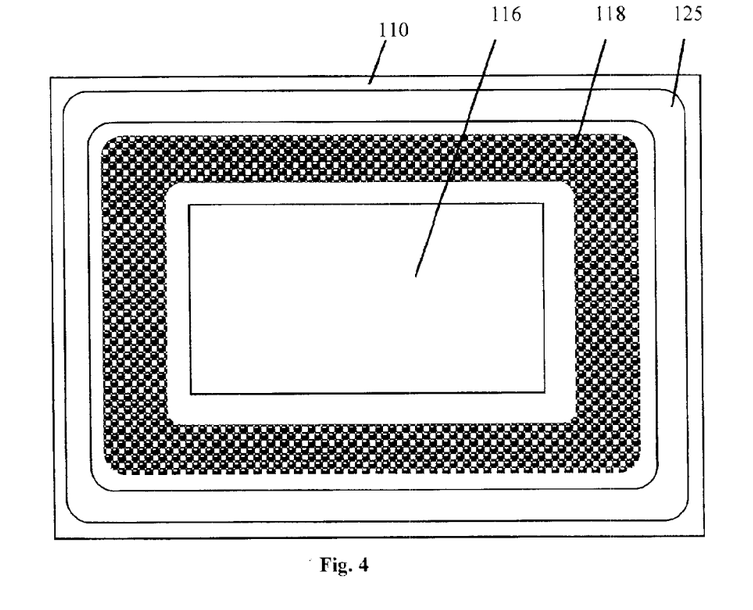
FIGS. 4 and 5 are simplified schematic representations (plan view, with cover removed) of two OLED structures in accordance with embodiments of the present invention.
Figure 5:
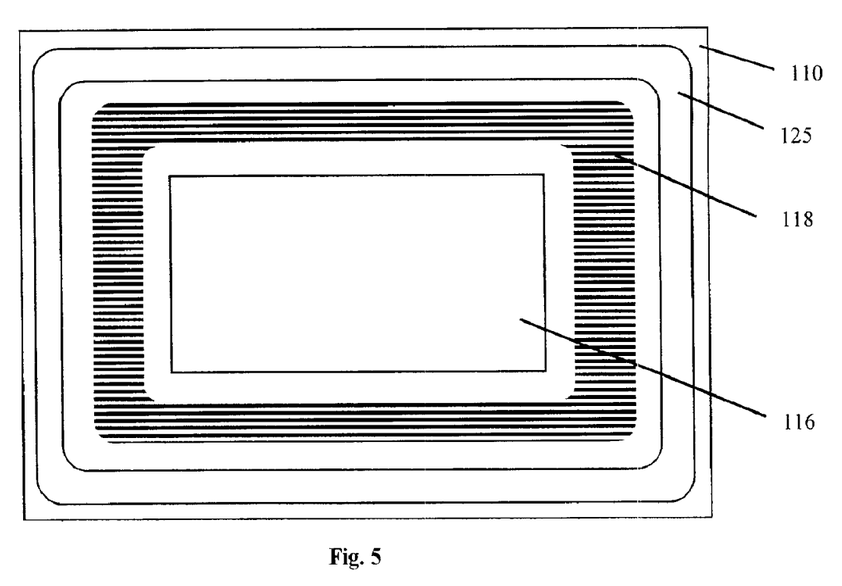

FIG. 4 illustrates a portion of an OLED structure similar to that of FIG. 2A. Illustrated are the substrate 110, OLED display area 116, patterned getter layer 118 and sealing region 125 of the OLED structure. Unlike FIG. 2A, however, the patterned getter layer 118 is provided in the form of a series of small dots. Similarly, FIG. 5 is like FIG. 2A, except that the patterned getter layer 118 is provided in the form of a series of narrow bands.

In general, the patterned getter layers of the present invention can be provided essentially anywhere within the sealed portion of the OLED structure, except in a position where it will block the transmission of light from the pixel to the viewing position (e.g., over the pixel). Hence, the patterned getter layer can be provided between pixels within the OLED display area 116 if desired.

Figure 6:
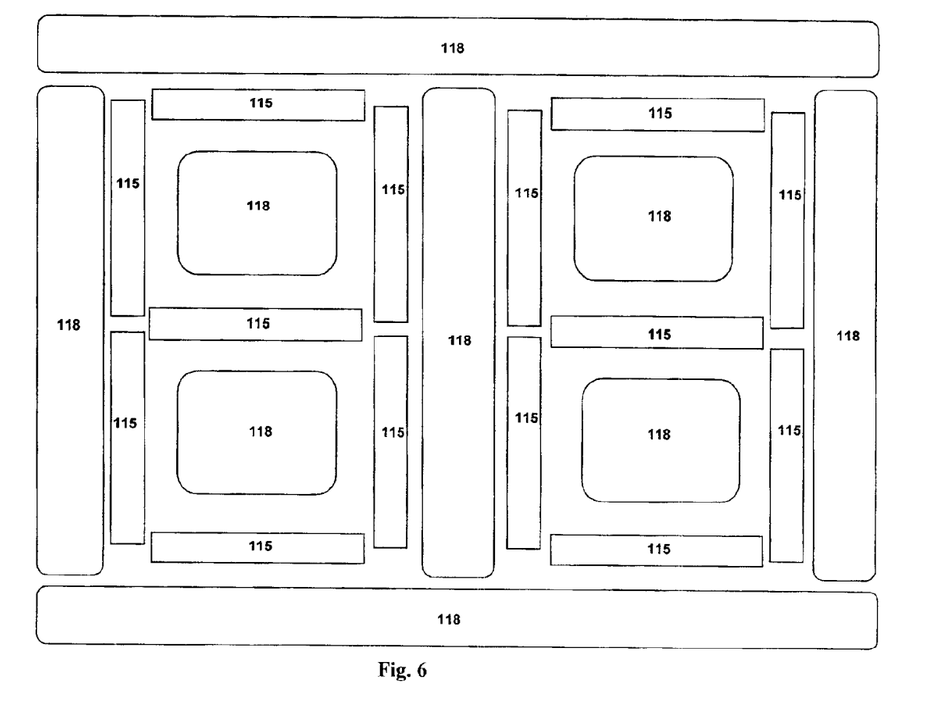
FIGS. 6 and 7 are simplified schematic representations (plan view) illustrating layouts of the pixels and patterned getter layers of OLED structures in accordance with embodiments of the present invention.

One such embodiment is illustrated in FIG. 6. FIG. 6 contains an OLED display area layout that is sometimes referred to as a "segmented display". The layout illustrated consists of two groups of seven active pixels 115. Due to the pixel layout in the particular embodiment shown, this display is capable of illuminating, for example, a pair of numerals between 0–9, depending on which of the pixels 115 are selected for illumination. Portions of a patterned getter layer 118 are illustrated, which portions are provided between pixels 115 and are also provided outside of pixels 115. Because each pixel has an adjacent getter reservoir, this design can be referred to as having "pixel-by-pixel gettering".

Typically electronic circuitry that is involved in illuminating the active pixels 115 will lie over the substrate and beneath patterned getter layer 118. Moreover, various additional layers can be provided. For example, a protective layer such as a nitride layer (not shown) can be provided between the circuitry and the patterned getter layer 118 if desired.

Figure 7:
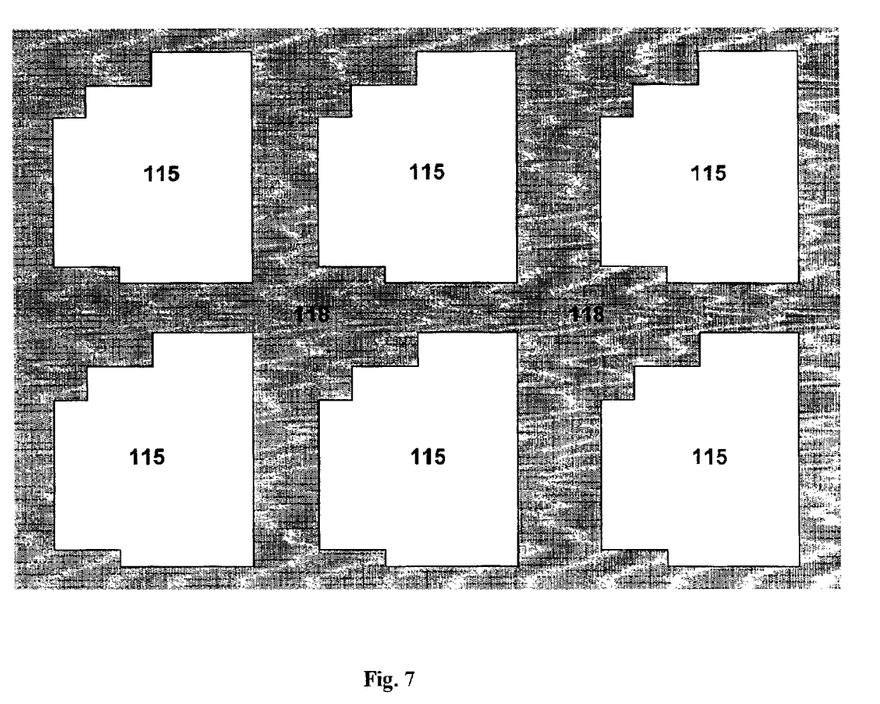

The principles used in connection with FIG. 6 are applicable to various other embodiments including both passive matrix and active matrix OLED displays. For example, FIG. 7 illustrates a series of six active matrix pixels 115 which may constitute part of a much larger active matrix OLED display area, such as that used in connection with televisions and computer monitors. As with FIG. 6, a patterned getter layer 118 is provided between and around the active matrix pixels 115. In this way, the patterned getter layer 118 will not obstruct illumination from the active matrix pixels 115, but will overlie other portions of the OLED structure for which the transparency of the overlying layer is irrelevant for many applications (for example, the electrical circuitry).

Note that although FIGS. 6 and 7 both provide pixel-by-pixel gettering, in the device of FIG. 7 a single (albeit complex-shaped) reservoir is provided for all of the pixels, while in FIG. 6, multiple reservoirs are supplied. Hence, several getter regions can protect a single pixel, or a single getter region can protect a single pixel, a few pixels, the entire array of pixels, and so forth.

Furthermore, as noted above, a composite barrier layer, such as that illustrated in FIG. 3, is advantageous in that it is flexible and transparent and thus can be used in connection with flexible OLED devices. Unfortunately, such composite barrier layers typically have defects, such as pinholes, that allow for the transmission of harmful species through the composite barrier layer (this type of transmission is referred to herein as "transverse transmission"). This is in contrast to rigid materials such as glass, which are typically highly impermeable. As a result, instead of transverse transmission from the outside environment in the direction of the OLED, oxygen and water are typically laterally transmitted in the direction of the OLED (this type of transmission is referred to herein as "lateral transmission") from the seals that are formed at the edges of the device, as such seals are typically the weakest point (from a permeability standpoint) in the enclosure formed around the OLED.

Hence, although lateral transmission of moisture and oxygen may be effectively combated by using a patterned getter layer that is provided at a position that is laterally beyond the OLED display area (for instance, in the form of a ring that laterally surrounds the OLED display area), this getter design may be less effective for flexible OLED devices, which contain composite barrier layers through which harmful outside species can be transversely transmitted at a position directly over the OLED. In such instances, and where the OLED structure includes numerous pixels, the gettering material can be provided adjacent each pixel over non-emitting regions of the OLED display area as illustrated in FIGS. 6 and 7 above, for example. In this way, each pixel has a reservoir of getter material adjacent to it, protecting it from transverse transmission of harmful species.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An OLED device structure comprising:
   a substrate;
   an OLED display area comprising a plurality of active pixels which are disposed over said substrate and which comprise an anode region, a cathode region and a light-emitting region;
   a cover over said OLED display area, wherein said cover permits transmission of light from maid active pixels to an outer environment, and wherein said cover and said substrate cooperate to restrict transmission of oxygen and water vapor from said outer environment to said OLED display area; and
   a patterned getter layer disposed between said substrate and said cover, said patterned getter layer being configured so as to substantially avoid obstructing said transmission of light that is permitted by said cover from said pixels to said outer environment, wherein at least a portion of said patterned getter layer is provided between at least some of said plurality of pixels.

2. The OLED device structure of claim 1, wherein said patterned getter layer is provided on said substrate.

3. The OLED device structure of claim 1, wherein said patterned getter layer is provided on said cover.

4. The OLED device structure of claim 1, wherein a portion of said patterned getter layer is provided at a position that is laterally beyond said OLED display area.

5. The OLED device structure of claim 4, wherein a portion of said patterned getter layer is provided in the form of a ring that laterally surrounds said OLED display area.

6. The OLED device structure of claim 1, wherein said patterned getter layer comprises at least one material selected from Group IIA metals and Group IIA metal oxides.

7. The OLED device structure of claim 1, wherein said patterned getter layer comprises at least one material selected from calcium metal, barium metal, calcium oxide and barium oxide.

8. The OLED device structure of claim 1, wherein said OLED device structure is a flexible OLED device structure, and wherein portions of said patterned getter layer are sufficiently narrow to prevent said patterned getter layer from cracking when said OLED device structure is flexed dining normal service.

9. The OLED device structure of claim 1, wherein said light emitting region comprises a hole transporting layer, an emission layer and an electron transporting layer.

10. The OLED device structure of claim 1, wherein said substrate, said anode region and said cathode region each permits transmission of light between said light-emitting region and said outer environment.

11. The OLED device structure of claim 1, wherein said anode region is disposed under said light-emitting region, and wherein said cathode is disposed over said light-emitting region and permits transmission of light between said light-emitting region and said outer environment.

12. The OLED device structure of claim 1, wherein said cathode region is disposed under said light-emitting region, and wherein said anode is disposed over said light-emitting region and permits transmission of light between said light-emitting region and said outer environment.

13. The OLED device structure of claim 1, further comprising a sealing region disposed between said substrate and said cover, said sealing region cooperating with said substrate and said cover to enclose said OLED display area and restrict transmission of water and oxygen from an outer environment to said OLED display area.

14. The OLED device structure of claim 1, wherein said patterned getter layer comprises a plurality of narrow bands of getter material or a plurality of dots of getter material.

15. The OLED device structure of claim 1, wherein said OLED device structure is a top emission OLED device structure.

16. The OLED device structure of claim 15, wherein said top emission OLED device structure is a flexible top emission OLED device structure.

17. A method of making an OLED device structure comprising:
   providing a substrate;
   forming an OLED display area over said substrate, said OLED display area comprising a plurality of active pixels that comprise an anode region, a cathode region and a light-emitting region;
   providing a cover over said OLED display area, wherein said cover permits transmission of light from said active pixels to an outer environment, and wherein said cover and said substrate cooperate to restrict transmission of oxygen and water vapor from said outer environment to said OLED display area; and
   providing a patterned getter layer between said substrate and said cover, said patterned getter layer being configured so as to substantially avoid obstructing said transmission of light that is permitted by said cover from said pixels to said outer environment, wherein at least a portion of said patterned getter layer is provided between at least some of said plurality of pixels.

18. The method of claim 17, wherein said patterned getter layer comprises a metal, and wherein said patterned getter layer is provided by vacuum deposition through a masking layer.

19. The method of claim 17, wherein said patterned getter layer comprises a metal oxide, and wherein said patterned getter layer is provided by applying a getter material in the form of a paste.

20. The method of claim 19, wherein said paste is applied by a technique selected from screen-printing and extrusion.

21. The method of claim 17, wherein said OLED device structure is a top emission OLED device structure.

22. The method of claim 21, wherein said top emission OLED device structure is a flexible top emission OLED device structure.

23. A flexible OLED device structure comprising:
   a flexible substrate;
   a flexible OLED display area comprising a plurality of active pixels disposed over said substrate, which comprise an anode region, a cathode region and a light-emitting region;
   a flexible cover over said OLED display area, wherein at least one of said flexible substrate and said flexible cover permits transmission of light from said plurality of active pixels to an outer environment, and wherein said flexible cover and said flexible substrate cooperate to restrict transmission of oxygen and water vapor from said outer environment to said OLED display area; and
   a patterned getter layer disposed between said flexible substrate and said flexible cover, wherein said patterned getter layer is configured so as to substantially avoid obstructing said transmission of light from said plurality of active pixels to said outer environment, wherein at least a portion of said patterned getter layer is provided between at least some of said plurality of pixels.

24. The flexible OLED device structure of claim 23, wherein at least one of said flexible substrate and said flexible cover comprises a composite barrier region, said composite barrier region further comprising two or more planarizing layers and two or more high-density layers.

25. The flexible OLED device structure of claim 23, wherein said patterned getter layer comprises at least one material selected from Group IIA metals and Group IIA metal oxides.

26. The flexible OLED device structure of claims 23, wherein portions of said patterned getter layer are sufficiently narrow to prevent said patterned getter layer from cracking when said OLED device structure is flexed during normal service.

27. The flexible OLED device structure of claim 26, wherein said patterned getter layer comprises a plurality of dots of getter material.

28. The flexible OLED device structure of claim 23, wherein a portion of said patterned getter layer is provided adjacent to each of said plurality of pixels.

29. The flexible OLED device structure of claim 23, wherein said flexible substrate and said flexible cover each comprises a composite barrier region that further comprises two or more planarizing layers and two or more high-density layers.

30. The flexible OLED device structure of claim 23, wherein said flexible cover comprises a composite barrier region that further comprises two or more planarizing layers and two or more high-density layers.

31. The flexible OLED device structure of claim 30, wherein said flexible cover further comprises a substrate-sub-layer.

32. The flexible OLED device structure of claim 23, wherein said flexible substrate comprises a metal foil.

33. The flexible OLED device structure of claim 23, wherein said substrate, said anode region and said cathode region each permits transmission of light between said light-emitting region and said outer environment.

34. The flexible OLED device structure of claim 23, wherein said anode region is disposed under said light-emitting region, and wherein said cathode is disposed over said light-emitting region, and permits transmission of light between said light-emitting region and said outer environment.

35. The flexible OLED device structure of claim 23, wherein said cathode region is disposed under said light-emitting region, and wherein said anode is disposed over said light-emitting region and permits transmission of light between said light-emitting region and said outer environment.

36. A flexible OLED device structure comprising:
   a flexible substrate;
   a flexible OLED display area comprising a plurality of active pixels disposed over said substrate, each of said plurality of active pixels comprising an anode region, a cathode region and a light-emitting region;
   a flexible cover over said OLED display area, wherein at least one of said flexible substrate and said flexible cover permits transmission of light from said plurality of active pixels to an outer environment, and wherein said flexible cover and said flexible substrate cooperate to restrict transmission of oxygen and water vapor from said outer environment to said OLED display area; and
   a patterned getter layer disposed between said flexible substrate and said flexible cover, said patterned getter layer being configured so as to substantially avoid obstructing said transmission of light from said plurality of active pixels to said outer environment, wherein portions of said patterned getter layer are sufficiently narrow to prevent said patterned getter layer from cracking when said OLED device structure is flexed during normal service and wherein said patterned getter layer comprises a plurality of narrow bands of getter material.

* * * * *

UNITED STATES PATENT AND TRADEMARK OFFICE
CERTIFICATE OF CORRECTION

PATENT NO. : 6,888,307 B2
DATED : May 3, 2005
INVENTOR(S) : Jeffrey Alan Silvernail et al.

It is certified that error appears in the above-identified patent and that said Letters Patent is hereby corrected as shown below:

Title page,
Item [57], ABSTRACT,
Line 17, change "structures" to -- structure --.

Column 2,
Line 42, after "of the" delete "of the".

Column 4,
Line 52, after "layer"", delete "layer".

Column 5,
Line 9, after "cover 120", delete "will be".
Line 37, before "flexible" change "a" to -- as --.

Column 6,
Line 65, change "Torr Seal" to -- Torr Seal® --.

Column 7,
Line 6, change last word "layer" to -- layers --.
Line 12, after "cathode", insert -- layer --.
Line 15, delete first word "is".
Line 18, change "light emitting" to -- light-emitting --.

Column 9,
Line 52, before "active", change "maid" to -- said --.

Column 10,
Line 19, change first word "dining" to -- during --.

Column 12,
Line 15, change "sub-layer" to -- sublayer --.
Line 23, after "cathode" insert -- region --.

UNITED STATES PATENT AND TRADEMARK OFFICE
CERTIFICATE OF CORRECTION

PATENT NO.    : 6,888,307 B2
DATED         : May 3, 2005
INVENTOR(S)   : Jeffrey Alan Silvernail et al.

It is certified that error appears in the above-identified patent and that said Letters Patent is hereby corrected as shown below:

<u>Column 12 (cont'd),</u>
Line 29, after "anode" insert -- region --.

Signed and Sealed this

First Day of November, 2005

JON W. DUDAS
*Director of the United States Patent and Trademark Office*